United States Patent
Son et al.

(10) Patent No.: US 10,732,500 B2
(45) Date of Patent: Aug. 4, 2020

(54) PHOTOMASK, LAMINATE COMPRISING PHOTOMASK, PHOTOMASK PREPARATION METHOD, PATTERN FORMING APPARATUS USING PHOTOMASK AND PATTERN FORMING METHOD USING PHOTOMASK

(71) Applicant: LG CHEM, LTD., Seoul (KR)

(72) Inventors: Yong Goo Son, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 126 days.

(21) Appl. No.: 15/580,239

(22) PCT Filed: Jul. 28, 2016

(86) PCT No.: PCT/KR2016/008297
§ 371 (c)(1),
(2) Date: Dec. 6, 2017

(87) PCT Pub. No.: WO2017/018830
PCT Pub. Date: Feb. 2, 2017

(65) Prior Publication Data
US 2018/0188645 A1    Jul. 5, 2018

(30) Foreign Application Priority Data

Jul. 28, 2015 (KR) .................. 10-2015-0106838

(51) Int. Cl.
| | | |
|---|---|---|
| *G03F 1/54* | (2012.01) | |
| *G03F 1/48* | (2012.01) | |
| *G03F 7/20* | (2006.01) | |
| *G03F 1/50* | (2012.01) | |
| *G03F 1/38* | (2012.01) | |
| *G03F 7/30* | (2006.01) | |

(52) U.S. Cl.
CPC ................. *G03F 1/48* (2013.01); *G03F 1/38* (2013.01); *G03F 1/50* (2013.01); *G03F 7/7035* (2013.01); *G03F 7/20* (2013.01); *G03F 7/2014* (2013.01); *G03F 7/2035* (2013.01); *G03F 7/30* (2013.01)

(58) Field of Classification Search
CPC .... G03F 7/2035; G03F 7/2014; G03F 7/7035; G03F 1/48; G03F 1/54
See application file for complete search history.

(56) References Cited

U.S. PATENT DOCUMENTS

| | | |
|---|---|---|
| 4,735,890 A | 4/1988 | Nakane |
| 6,821,869 B2 | 11/2004 | Yanagi et al. |
| 2005/0100798 A1 | 5/2005 | Lin et al. |
| 2005/0151944 A1 | 7/2005 | Park et al. |
| 2006/0251972 A1 | 11/2006 | Lee |
| 2011/0253425 A1 | 10/2011 | Haase et al. |
| 2014/0151935 A1* | 6/2014 | Slafer ................ B29C 35/0888 264/446 |
| 2015/0151528 A1 | 6/2015 | Shimizu et al. |

FOREIGN PATENT DOCUMENTS

| | | |
|---|---|---|
| CN | 1637617 A | 7/2005 |
| CN | 102301280 A1 | 12/2011 |
| CN | 104395083 A | 3/2015 |
| JP | 05066554 | 3/1993 |
| JP | H05-265196 | 10/1993 |
| JP | 06075358 | 3/1994 |
| JP | 09162161 | 6/1997 |
| JP | H1180594 | 3/1999 |
| JP | 2001296650 | 10/2001 |
| JP | 2003029424 | 1/2003 |
| JP | 2007506991 | 3/2007 |
| JP | 2007-140444 | 6/2007 |
| JP | 2008248135 | 10/2008 |
| JP | 2008311462 | 12/2008 |
| JP | 2010107886 | 5/2010 |
| KR | 1020090003601 | 1/2009 |

* cited by examiner

*Primary Examiner* — Daborah Chacko-Davis
(74) *Attorney, Agent, or Firm* — Dentons US LLP

(57) ABSTRACT

The present specification relates to a photomask, a laminate including the photomask, a method for manufacturing the photomask, a device for forming a pattern using the photomask, and a method for forming a pattern using the photomask.

18 Claims, 3 Drawing Sheets

[FIG. 1]
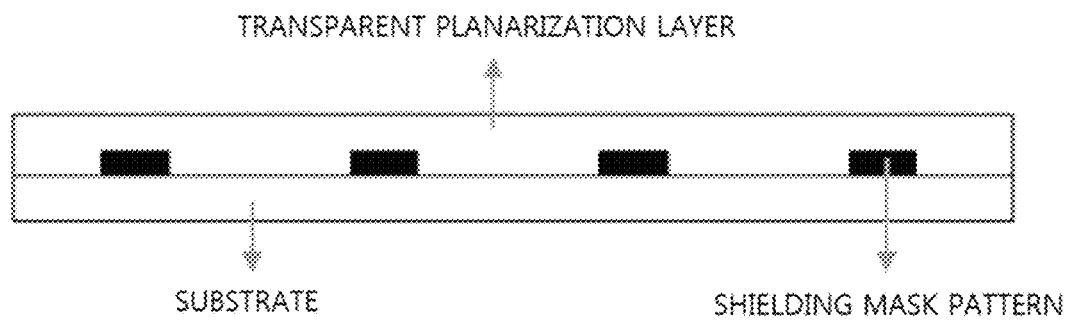
[FIG. 2]
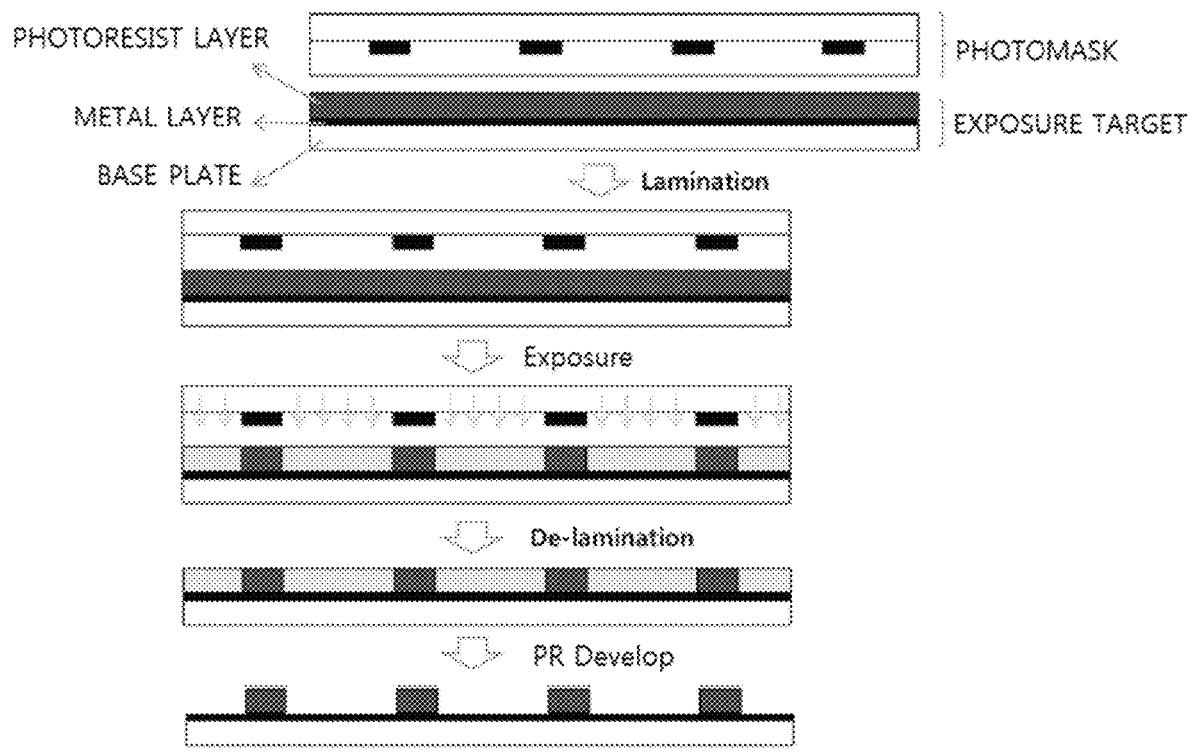

[FIG. 3]
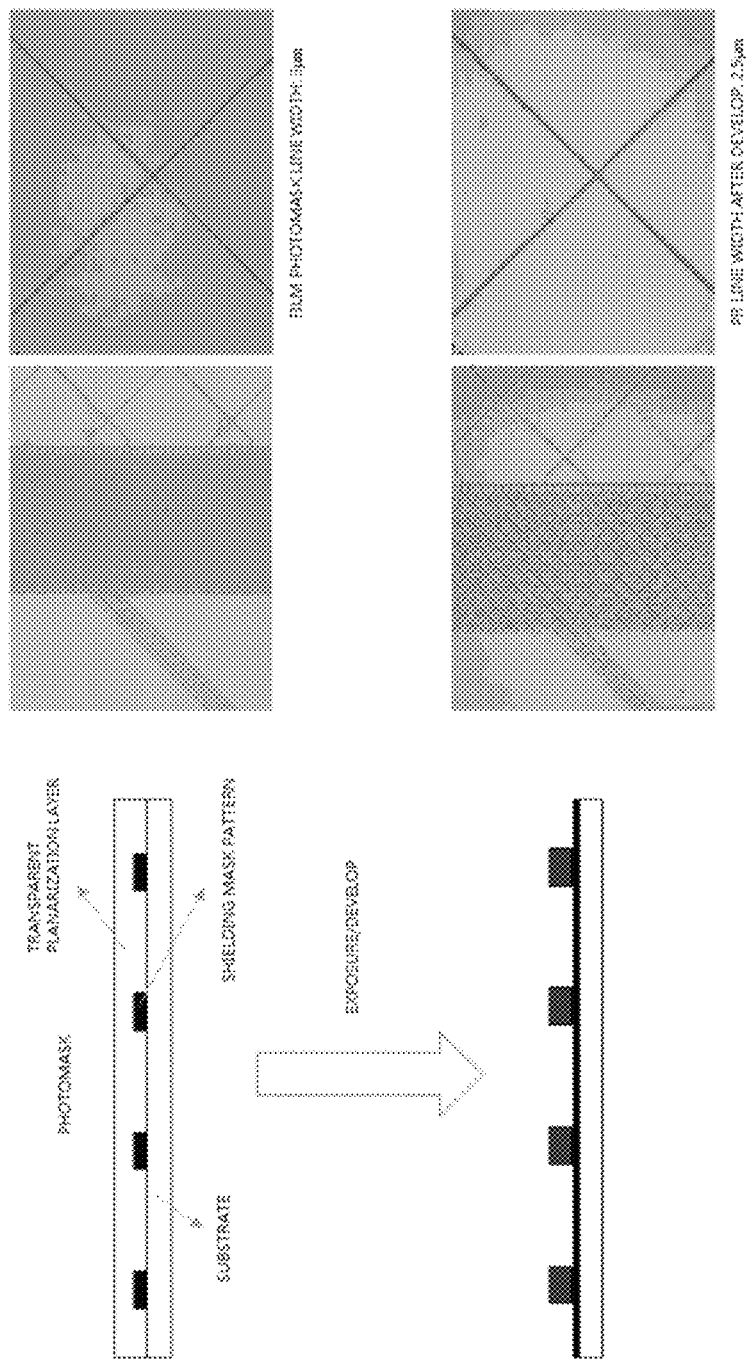

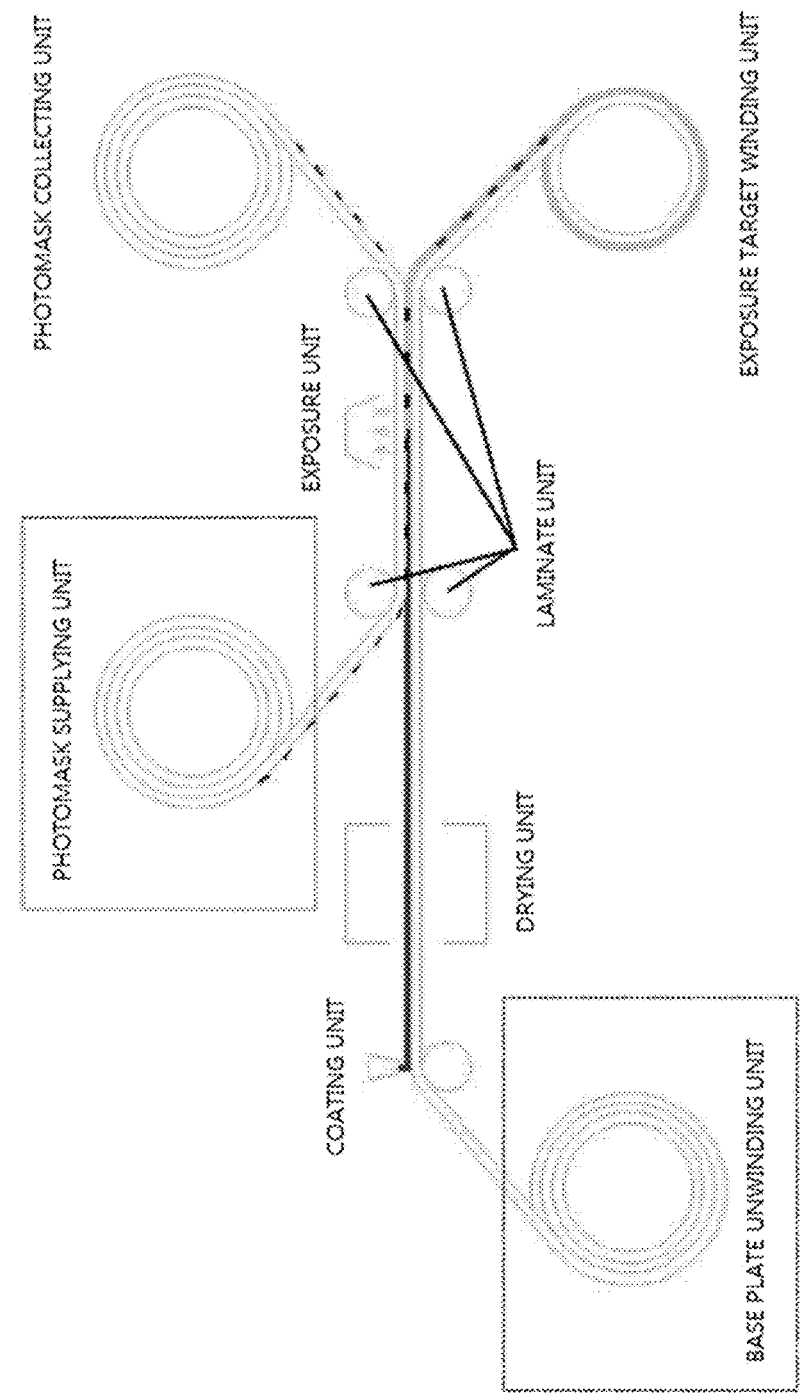
[FIG. 4]

PHOTOMASK, LAMINATE COMPRISING PHOTOMASK, PHOTOMASK PREPARATION METHOD, PATTERN FORMING APPARATUS USING PHOTOMASK AND PATTERN FORMING METHOD USING PHOTOMASK

TECHNICAL FIELD

This application is a National Stage Application of International Application No. PCT/KR2016/008297 filed on Jul. 28, 2016, which claims priority to and the benefits of Korean Patent Application No. 10-2015-0106838, filed with the Korean Intellectual Property Office on Jul. 28, 2015 both of which are incorporated herein in their entirety by reference for all purposes as if fully set forth herein.

The present specification relates to a photomask, a laminate including the photomask, a method for manufacturing the photomask, a device for forming a pattern using the photomask and a method for forming a pattern using the photomask.

BACKGROUND ART

When forming a pattern of a display apparatus, a photolithography method using a photomask is often used among methods forming a pattern on a substrate.

The photolithography method refers to all processes uniformly coating a photoresist on a base plate, exposing a pattern on a photomask using an exposure apparatus and the photomask, and then going through developing and post bake processes to form a target pattern.

When the photoresist layer is a positive resist layer, chemical changes occur in the resist layer material in the exposed region, and the material may fell off from the resist layer during the development. Meanwhile, when the photoresist layer is a negative resist layer, a material that is not exposed falls off during the development.

Herein, the photolithography method forms a resist pattern with a fixed shape on a resist film by disposing a mask pattern-formed permeable substrate as a photomask and irradiating light on the photomask.

DISCLOSURE

Technical Problem

The present specification is directed to providing a photomask, a laminate including the photomask, a method for manufacturing the photomask, a device for forming a pattern using the photomask and a method for forming a pattern using the photomask.

Technical Solution

One embodiment of the present specification provides a photomask including a substrate; a shielding mask pattern provided on the substrate; and a transparent planarization layer located on a surface of the substrate provided with the shielding mask pattern, wherein the transparent planarization layer has a thickness of greater than or equal to 1 µm and less than or equal to 500 µm, the thickness of the transparent planarization layer is larger than a thickness of the shielding mask pattern, and the transparent planarization layer has surface roughness (Ra) of 0.1 nm to 20 nm.

Another embodiment of the present specification provides a laminate including an exposure target including a base plate and a photoresist layer provided on the base plate; and a photomask including a substrate, a shielding mask pattern provided on the substrate, and a transparent planarization layer located on a surface of the substrate provided with the shielding mask pattern, wherein the photoresist layer of the exposure target is in contact with the transparent planarization layer of the photomask.

Still another embodiment of the present specification provides a device for forming a pattern including a base plate unwinding unit and an exposure target winding unit; a coating unit coating a photoresist on a base plate supplied from the base plate unwinding unit; a drying unit drying an exposure target coated with the photoresist; a photomask supplying unit supplying a photomask including a shielding mask pattern provided on a substrate and a transparent planarization layer located on a surface of the substrate provided with the shielding mask pattern; a photomask collecting unit collecting the photomask; a laminate unit pressurizing so that the photoresist of the exposure target is in contact with the transparent planarization layer of the photomask; and an exposure unit irradiating light from a side of the substrate of the photomask.

Yet another embodiment of the present specification provides a method for manufacturing a photomask including forming a shielding mask pattern on a substrate; and forming a transparent planarization layer located on a surface of the substrate provided with the shielding mask pattern.

Still yet another embodiment of the present specification provides a method for forming a pattern including preparing an exposure target including a photoresist layer provided on a base plate; laminating so that the photoresist layer of the exposure target is in contact with the transparent planarization layer of the photomask, which including a shielding mask pattern provided on a substrate and a transparent planarization layer located on a surface of the substrate provided with the shielding mask pattern; exposing by irradiating light from a side of the substrate of the photomask; and separating the photomask from the exposure target after the exposing.

Advantageous Effects

Using a photomask according to the present specification has an advantage in that an exposure process can be continuously carried out in a short period of time using a roll-to-roll method.

By using a transparent planarization layer, the photomask according to the present specification is capable of preventing contamination caused by a contact between a photoresist layer of an exposure target and a shielding pattern layer.

DESCRIPTION OF DRAWINGS

FIG. 1 is a vertical sectional view of a photomask according to one embodiment of the present specification.

FIG. 2 is a flow chart illustrating a method for forming a pattern using a photomask according to one embodiment of the present specification.

FIG. 3 shows images of a photomask according to one embodiment of the present specification and a pattern formed using the same.

FIG. 4 is a mimetic diagram of a device for forming a pattern according to one embodiment of the present specification.

MODE FOR DISCLOSURE

Hereinafter, the present specification will be described in detail.

One embodiment of the present specification provides a photomask including a substrate; a shielding mask pattern provided on the substrate; and a transparent planarization layer located on a surface of the substrate provided with the shielding mask pattern, wherein the transparent planarization layer has a thickness of greater than or equal to 1 μm and less than or equal to 500 μm, the thickness of the transparent planarization layer is larger than a thickness of the shielding mask pattern, and the transparent planarization layer has surface roughness (Ra) of 0.1 nm to 20 nm.

When the thickness of the transparent planarization layer is larger than the thickness of the shielding mask pattern, contamination caused by a contact between the photoresist layer of the exposure target and the shielding pattern may be prevented.

The photomask may be stored as being wound around a roll so as to be used in a roll-to-roll process.

Materials of the substrate are not particularly limited, however, those having favorable adhesion with the shielding mask pattern and the transparent planarization layer, and as a substrate of the photomask, those having a minimum influence on light penetrating the photomask are preferred.

The substrate may be a hard substrate or a flexible substrate. Specifically, the flexible substrate may be a plastic substrate or a plastic film. The plastic substrate or the plastic film is not particularly limited, and examples thereof may include any one or more of polyacrylate, polypropylene (PP), polyethylene terephthalate (PET), polyethylene ether phthalate, polyethylene phthalate, polybuthylene phthalate, polyethylene naphthalate (PEN), polycarbonate (PC), polystyrene (PS), polyether imide, polyether sulfone, polydimethyl siloxane (PDMS), polyetheretherketone (PEEK) and polyimide (PI).

When the substrate is a flexible substrate, there is an advantage in that the photomask is capable of being stored as being wound around a roll so as to be used in a roll-to-roll process.

As the substrate, substrates having high transparency may be used, and light transmittance of the substrate may be 50% or greater.

A difference between the refractive index of the substrate and the refractive index of the transparent planarization layer is preferably small, and the refractive index of the substrate may be greater than or equal to 1.45 and less than or equal to 1.65.

The shielding mask pattern is formed with materials capable of shielding light, is not particularly limited as long as it is a material capable of shielding light and readily forming a pattern, and may be formed with materials generally used in the art. For example, the shielding mask pattern may be a metal pattern, and specifically, the metal pattern may be formed with at least one of copper (Cu), chromium (Cr), aluminum (Al), molybdenum (Mo), nickel (Ni), gold (Au) and silver (Ag).

A method for forming the shielding mask pattern is not particularly limited as long as it is capable of forming a shielding pattern on a substrate, and examples thereof may include roll printing, an inkjet printing method, a screen printing method, a deposition method, a photolithography method, an etching method and the like.

The form of the shielding mask pattern may be a pattern form in a field requiring a metal pattern or a photoresist pattern.

The form of the shielding mask pattern may be a form of a metal pattern of a touch panel, and may be a form repeating the same pattern or a form separating or connecting two or more different patterns. For example, as illustrated in FIG. 3, the form of the shielding mask pattern may be at least one of a lattice screen unit pattern, a router pattern connected to the screen unit pattern and connected to an external soft printing circuit board, and a connecting pattern reducing resistance when connecting the screen unit pattern and the router pattern.

The shielding mask pattern has a thickness of greater than or equal to 20 nm and less than or equal to 500 nm.

The transparent planarization layer covers the whole surface of the substrate provided with the shielding mask pattern, and a surface of the transparent planarization layer opposite to the surface adjoining the substrate provided with the shielding mask pattern is a flat layer. Of the transparent planarization layer, surface roughness (Ra) representing a degree of planarization of the surface opposite to the surface adjoining the substrate provided with the shielding mask pattern is preferably greater than or equal to 0.1 nm and less than or equal to 20 nm. When the surface roughness satisfies the above-mentioned range, air is locked in the sunken part due to surface flexure, and by the air distributing relatively more therein compared to the projected part, scattering or refraction of incident light caused by a difference in the refractive index of the produced air is prevented, which is effective in enhancing pattern obtainment.

As the transparent planarization layer, those that are not shielded by the shielding mask pattern and having a minimum influence on light penetrating the photomask are preferred. Materials having high transparency may be used as the transparent planarization layer, and the transparent planarization layer may have light transmittance of 50% or greater.

A difference between the refractive index of the transparent planarization layer and the refractive index of the substrate is preferably small, and the refractive index of the transparent planarization layer may be greater than or equal to 1.43 and less than or equal to 1.49.

A distance from one point where the transparent planarization layer is in contact with the substrate to a surface of the transparent planarization layer opposite to the surface adjoining the substrate provided with the shielding mask pattern may be higher than the height of the shielding mask pattern.

The transparent planarization layer may have a thickness of greater than or equal to 1 μm and less than or equal to 500 μm. Specifically, the distance from one point where the transparent planarization layer is in contact with the substrate to a surface of the transparent planarization layer opposite to the surface adjoining the substrate provided with the shielding mask pattern is greater than or equal to 1 μm and less than or equal to 500 μm. More specifically, the distance from one point where the transparent planarization layer is in contact with the substrate to the surface of the transparent planarization layer opposite to the surface adjoining the substrate provided with the shielding mask pattern may be greater than or equal to 1 μm and less than or equal to 50 μm. When the thickness of the transparent planarization layer satisfies the above-mentioned range, the distance to the photoresist surface is sufficiently close even when light path changes by a diffraction phenomenon while some of the irradiated light passes through the shielding mask pattern, which is effective in enhancing pattern obtainment.

The transparent planarization layer preferably has an excellent coating property so as to form a flat layer, has high light transmittance, and has adhesive and releasing properties so as to be attached to and separated from surfaces of other materials.

The transparent planarization layer may include a silicone-based resin, specifically, may include a siloxane-based resin, and more specifically, may include polydimethylsiloxane (PDMS).

Another embodiment of the present specification provides a laminate including an exposure target including a base plate and a photoresist layer provided on the base plate; and a photomask including a substrate, a shielding mask pattern provided on the substrate, and a transparent planarization layer located on a surface of the substrate provided with the shielding mask pattern, wherein the photoresist layer of the exposure target is in contact with the transparent planarization layer of the photomask.

Materials of the base plate are not particularly limited, however, the base plate may be a hard material or a soft material.

The hard material may include glass, metals, hard plastics or thick plastics.

The soft material may include soft plastics or thin plastics.

The base plate may have a thickness of greater than or equal to 15 μm and less than or equal to 2 mm, however, the thickness is not limited thereto.

The photoresist layer (PR) means a layer including a polymer with varying tolerance for a developing solution by being exposed to light, and the photoresist layer may be a positive photoresist layer or a negative photoresist layer. Specifically, the photoresist layer is preferably a positive photoresist layer.

The photoresist layer may have a thickness of greater than or equal to 100 nm and less than or equal to 10 μm, however, the thickness is not limited thereto.

The exposure target may further include a metal layer provided between the base plate and the photoresist layer.

Materials of the metal layer are not particularly limited, however, the metal layer may be formed with at least one of copper (Cu), chromium (Cr), aluminum (Al), molybdenum (Mo), nickel (Ni), gold (Au) and silver (Ag).

As for the descriptions on the photomask in the laminate, the description on the photomask provided above may be used.

Still another embodiment of the present specification provides a device for forming a pattern including a base plate unwinding unit and an exposure target winding unit; a coating unit coating a photoresist on a base plate supplied from the base plate unwinding unit; a drying unit drying an exposure target coated with the photoresist; a photomask supplying unit supplying a photomask including a shielding mask pattern provided on a substrate and a transparent planarization layer located on a surface of the substrate provided with the shielding mask pattern; a photomask collecting unit collecting the photomask; a laminate unit pressurizing so that the photoresist of the exposure target is in contact with the transparent planarization layer of the photomask; and an exposure unit irradiating light from a side of the substrate of the photomask.

The base plate unwinding unit and the exposure target winding unit supply a base plate and collect an exposure target gone through a series of processes, and by controlling rates of the base plate unwinding unit and the exposure target winding unit, tension provided to the base plate may be controlled.

The base plate unwinding unit and the exposure target winding unit may have a roll shape, and may each be a base plate unwinding roll having a base plate wound around a roll and an exposure target winding roll winding an exposure target gone through a series of processes.

The base plate supplied from the base plate unwinding unit may be a base plate provided with a metal layer on one surface.

The coating unit is located between the base plate unwinding unit and the exposure target winding unit and is capable of coating a photoresist on the base plate supplied from the base plate unwinding unit, and specifically, is capable of coating a positive photoresist on the base plate supplied from the base plate unwinding unit.

Herein, the photoresist coated by the coating unit means a composition including a polymer with varying tolerance for a developing solution by being exposed to light, and the photoresist composition may further include at least one of a photoinitiator, a cross-linking agent, an additive and a solvent.

When the base plate supplied from the base plate unwinding unit is a base plate provided with a metal layer on one surface, the coating unit may coat the photoresist on the metal layer.

The drying unit dries the photoresist coated by the coating unit, and the drying method of the drying unit may be a hot-air drying method or an infrared drying method. Specifically, the drying method of the drying unit is preferably an infrared drying method. In other words, the drying unit may be an infrared drying unit. When the drying unit is an infrared drying unit, the photoresist film may be uniformly dried to the deep part thereof.

As for descriptions on the photomask in the device for forming a pattern, the descriptions on the photomask provided above may be used.

The photomask supplying unit and the photomask collecting unit supply a photomask and collect the photomask gone through a series of processes, and by controlling rates of the photomask supplying unit and the photomask collecting unit, tension provided to the photomask may be controlled.

The photomask supplying unit and the photomask collecting unit may have a roll shape, and may each be a photomask supplying roll having a photomask wound around a roll and a photomask collecting roll winding the photomask gone through a series of processes.

The laminate unit may pressurize and adhere so that the photoresist of the exposure target and the transparent planarization layer of the photomask are in contact with each other.

The laminate unit may include two pairs of pressure rolls. Specifically, the laminate unit may include one pair of first pressure rolls having any one located on the substrate side of the photomask and the other one corresponding thereto located on the base plate side of the exposure target; and another pair of second pressure rolls having any one located on the substrate side of the photomask and the other one corresponding thereto located on the base plate side of the exposure target, and separately disposed with the first pressure rolls. Herein, the pair of pressure rolls may be plane symmetric based on the laminate in which the photomask and the exposure target adhere. In other words, in the pair of pressure rolls that are plane symmetric, any one is located on one surface of the laminate and the other one is located on the other surface of the laminate with the laminate in which the photomask and the exposure target adhere as the center, and they may be provided so as to face each other across the laminate.

The exposure unit may irradiate light from a side of the substrate of the photomask.

When the laminate unit includes two pairs of pressure rolls, the exposure unit may be provided between the two pairs of pressure rolls.

The exposure condition of the exposure unit may be controlled depending on the properties of the coated photoresist, and is not particularly limited.

The device for forming a pattern may further include a developing unit developing the exposure target exposed by the exposure unit.

The developing unit may be provided with necessary equipment depending on developing method, and is not particularly limited.

Yet another embodiment of the present specification provides a method for manufacturing a photomask including forming a shielding mask pattern on a substrate; and forming a transparent planarization layer located on a surface of the substrate provided with the shielding mask pattern.

The method of forming a shielding mask pattern on a substrate may be inkjet printing, gravure printing, gravure offset printing, screen printing, reverse offset printing, and photolithography. Specifically, the method of forming a shielding mask pattern on a substrate may be photolithography, and after depositing shielding mask metals on a substrate and forming an etching resist pattern, the metals in a region that is not provided with the etching resist pattern are selectively removed through an etching process, and lastly, the etching resist pattern on the shielding mask pattern is peeled off to form the shielding mask pattern.

A transparent planarization layer may be formed on a surface of the substrate provided with the shielding mask pattern.

The method of forming a transparent planarization layer may include coating a composition for forming a transparent planarization layer on a surface of the substrate provided with the shielding mask pattern; drying the coated composition; and curing the dried composition.

The composition for forming a transparent planarization layer may include a silicone-based resin, specifically, may include a siloxane-based resin, and more specifically, include polydimethylsiloxane (PDMS).

The composition for forming a transparent planarization layer may further include a curing agent. The curing agent is not particularly limited, and materials generally used in the art may be selected.

The method of coating a composition for forming a transparent planarization layer is not particularly limited, and examples thereof may include bar coating, slot die coating, spin coating, comma coating, microgravure coating or dip coating.

Still yet another embodiment of the present specification provides a method for forming a pattern including preparing an exposure target including a photoresist layer provided on a base plate; laminating so that the photoresist layer of the exposure target is in contact with, in a photomask including a shielding mask pattern provided on a substrate and a transparent planarization layer located on a surface of the substrate provided with the shielding mask pattern, the transparent planarization layer of the photomask; exposing by irradiating light from a side of the substrate of the photomask; and separating the photomask from the exposure target after the exposing.

In the method for forming a pattern, descriptions duplicated with the descriptions provided above will not be repeated, and these may cite the descriptions provided above.

The method for forming a pattern may further include forming a photoresist pattern by developing the exposed exposure target after separating the photomask.

The method of developing the exposed exposure target may include forming a photoresist pattern in a manner of coating a developing solution on the exposed exposure target, or forming a photoresist pattern in a manner of immersing the exposed exposure target into a developing solution.

When the exposure target further includes a metal layer provided between the base plate and the photoresist layer, the method for forming a pattern may further include forming a photoresist pattern by developing the exposed exposure target after separating the photomask; and forming a metal pattern by etching a part of the metal layer where the photoresist pattern is not formed.

The forming of a metal pattern may include etching a part of the metal layer where the photoresist pattern is not formed; and removing the photoresist pattern after etching the metal layer.

Hereinafter, the present specification will be described in more detail with reference to example. However, the following examples are for illustrative purposes only, and are not to limit the present specification.

EXPERIMENTAL EXAMPLE 1

Preparation of Transparent Planarization Layer Coating Solution

A transparent planarization layer coating solution was prepared by mixing 100 parts by weight of a liquid silicone resin (Shin-Etsu Chemical Co., Ltd., KE-1606), 15 parts by weight of a silicone curing agent (Shin-Etsu Chemical Co., Ltd., CAT-RG) and 115 parts by weight of cyclohexane.

EXPERIMENTAL EXAMPLE 2

Manufacture of Photomask

After forming a resist pattern having a line width of 3 μm to 20 μm on a polyethylene terephthalate (PET) base plate with an aluminum (Al) layer deposited to a thickness of 100 nm using a reverse offset printing process, a shielding mask pattern was formed on the polyethylene terephthalate (PET) base plate through aluminum (Al) etching and resist peel-off processes. After coating the prepared transparent planarization layer coating solution on the top of the shielding mask pattern using a spin coating or slit coating method, the result was cured for 20 minutes at 100° C. to manufacture a photomask.

EXPERIMENTAL EXAMPLE 3

Manufacture of Photoresist-Coated Substrate

After coating a novolac resin-based positive photoresist (LG Chem. Ltd., LGPR-412DF) on an upper surface of a polyethylene terephthalate (PET) base plate with an aluminum (Al) layer deposited to a thickness of 100 nm using a spin coating or slit coating method, the result was dried for 3 minutes at 120° C. to form a photoresist film having a thickness of 1.5 μm.

EXPERIMENTAL EXAMPLE 4

Evaluation on Adhesive Property of Photomask

The photomask and the photoresist-coated substrate completed with preparation were laminated using a roll laminator. The laminated laminate was left unattended for 24 hours at room temperature and attachment conditions before and after the lamination were checked. In the following Table 1, the conditions were classified as O when attachment was maintained O, and x when lifting occurred between the two substrates.

EXPERIMENTAL EXAMPLE 5

Evaluation on Releasing Property of Photomask

The photomask and the photoresist-coated substrate completed with preparation were laminated using a roll laminator. After leaving the laminated laminate unattended for 24 hours at room temperature, the photomask was detached from the photoresist-coated substrate. The surface of the detached photomask was observed using a microscope to determine contamination. In the following Table 1, the conditions were classified as O when foreign substances were not present on the photomask surface and X when foreign substances were present.

EXPERIMENTAL EXAMPLE 6

Evaluation on Pattern Obtainment

The photomask and the photoresist-coated substrate completed with preparation were laminated using a roll laminator. After fixing the laminated laminate on a horizontality-maintaining surface plate, the laminated laminate was exposed for 1 second using a parallel light exposure apparatus (Karl Suss MA8). After removing the photomask from the laminate completed with exposure, the result was deposited 60 seconds in a 2.38 wt % tetramethylammonium hydroxide (TMAH) developing solution, and oil-water washed to form a photoresist pattern. In the following Table 1, characteristics of photoresist pattern obtainment was classified as follows.
A: rate of line width change and rate of line edge roughness (LER) increase were 30% or less with respect to photomask shielding mask pattern
B: rate of line width change was 30% or greater or rate of line edge roughness (LER) increase was 30% or greater with respect to photomask shielding mask pattern
C: pattern was not obtained EXAMPLES 1 to 3

Photoresists were manufactured and evaluated of their properties using the methods of Experimental Examples 1 to 6, and thickness and surface roughness of the transparent planarization layer were modified. Results obtained therefrom are shown in the following Table 1.

COMPARATIVE EXAMPLES 1 to 4

Photoresists were manufactured and evaluated of their properties in the same manner as in Examples 1 to 3 except that surface roughness increased by imprinting a base plate having high surface roughness in the transparent planarization layer preparation process or the transparent planarization layer was not used. Results obtained therefrom are shown in the following Table 1.

TABLE 1

| | Transparent Planarization Layer Thickness (μm) | Transparent Planarization Layer Surface Roughness (nm) | Obtainment of 3 μm Pattern | Obtainment of 20 μm Pattern | Adhesive Property | Releasing Property |
|---|---|---|---|---|---|---|
| Example 1 | 30 | <10 | A | A | ○ | ○ |
| Example 2 | 50 | <10 | A | A | ○ | ○ |
| Example 3 | 30 | 15-20 | A | A | ○ | ○ |
| Comparative Example 1 | Not Used | Not Used | Impossible to Evaluate | Impossible to Evaluate | X | X |
| Comparative Example 2 | 600 | <10 | C | B | ○ | ○ |
| Comparative Example 3 | 30 | 50-100 | B | A | ○ | ○ |
| Comparative Example 4 | 30 | >200 | C | B | X | ○ |

The invention claimed is:

1. A photomask comprising:
a substrate;
a shielding mask pattern provided on the substrate; and
a transparent planarization layer located on a surface of the substrate provided with the shielding mask pattern,
wherein:
the shielding mask pattern is a metal pattern,
the metal pattern is formed with at least one of copper (Cu), aluminum (Al), nickel (Ni), and gold (Au),
the shielding mask pattern has a thickness of greater than or equal to 100 nm and less than or equal to 500 nm,
the transparent planarization layer has a thickness of greater than or equal to 30 μm and less than or equal to 500 μm,
the thickness of the transparent planarization layer is larger than a thickness of the shielding mask pattern, and
the transparent planarization layer has surface roughness (Ra) of 0.1 nm to 20 nm.

2. The photomask of claim 1, wherein a distance from one point where the transparent planarization layer is in contact with the substrate to a surface of the transparent planarization layer opposite to the surface adjoining the substrate provided with the shielding mask pattern is higher than a height of the shielding mask pattern.

3. The photomask of claim 1, wherein the transparent planarization layer includes a silicone-based resin.

4. The photomask of claim 1, wherein the substrate is a flexible substrate.

5. The photomask of claim 1, wherein the photomask is stored as being wound around a roll so as to be used in a roll-to-roll process.

6. A laminate comprising:
an exposure target including a base plate and a photoresist layer provided on the base plate; and
a photomask of claim 1,
wherein the photoresist layer of the exposure target is in contact with the transparent planarization layer of the photomask.

7. The laminate of claim 6, wherein the photoresist layer is a positive photoresist layer.

8. The laminate of claim 6, wherein the exposure target further includes a metal layer provided between the base plate and the photoresist layer.

9. A device for forming a pattern comprising:
a base plate unwinding unit and an exposure target winding unit;
a coating unit coating a photoresist on a base plate supplied from the base plate unwinding unit;
a drying unit drying an exposure target comprising the base plate coated with the photoresist;
a photomask supplying unit supplying a photomask including a shielding mask pattern provided on a substrate and a transparent planarization layer located on a surface of the substrate provided with the shielding mask pattern;
a photomask collecting unit collecting the photomask;
a laminate unit pressurizing the exposure target and the photomask so that the photoresist of the base plate of the exposure target is in contact with the transparent planarization layer of the photomask; and
an exposure unit irradiating light from a side of the substrate of the photomask,
wherein the laminate unit includes two pairs of pressure rolls, and the exposure unit is provided between the two pairs of pressure rolls.

10. The device for forming a pattern of claim 9, wherein the base plate supplied from the base plate unwinding unit is a base plate provided with a metal layer on one surface, and the coating unit coats the photoresist on the metal layer.

11. The device for forming a pattern of claim 9, wherein the drying unit is an infrared drying unit.

12. The device for forming a pattern of claim 9, further comprising a developing unit developing the exposure target exposed by the exposure unit.

13. A method for manufacturing a photomask comprising:
forming a shielding mask pattern on a substrate, wherein the shielding mask pattern is a metal pattern, wherein the metal pattern is formed with at least one of copper (Cu), aluminum (Al), nickel (Ni), and gold (Au); and
forming a transparent planarization layer located on a surface of the substrate provided with the shielding mask pattern, wherein the transparent planarization layer has a thickness of greater than or equal to 30 μm and less than or equal to 500 μm.

14. The method for manufacturing a photomask of claim 13, wherein the forming of the transparent planarization layer includes coating a composition including a silicone-based resin on a surface of the substrate provided with the shielding mask pattern; and
drying and curing the composition.

15. A method for forming a pattern comprising:
preparing an exposure target including a photoresist layer provided on a base plate;
laminating so that the photoresist layer of the exposure target is in contact with a transparent planarization layer of the photomask, wherein the transparent planarization layer has a thickness of greater than or equal to 30 μm and less than or equal to 500 μm, which including a shielding mask pattern provided on a substrate and the transparent planarization layer located on a surface of the substrate provided with the shielding mask pattern, wherein the shielding mask pattern is a metal pattern, wherein the metal pattern is formed with at least one of copper (Cu), aluminum (Al), nickel (Ni), and gold (Au);
exposing by irradiating light from a side of the substrate of the photomask; and
separating the photomask from the exposure target after the exposing.

16. The method for forming a pattern of claim 15, further comprising forming a photoresist pattern by developing the exposed exposure target after separating the photomask.

17. The method for forming a pattern of claim 15, wherein the exposure target further includes a metal layer provided between the base plate and the photoresist layer.

18. The method for forming a pattern of claim 17, further comprising:
forming a photoresist pattern by developing the exposed exposure target after separating the photomask; and
forming a metal pattern by etching a part of the metal layer where the photoresist pattern is not formed.

* * * * *